United States Patent [19]

Davis et al.

[11] Patent Number: 4,940,645

[45] Date of Patent: Jul. 10, 1990

[54] IMAGING MATERIAL EMPLOYING PHOTOSENSITIVE MICROCAPSULES CONTAINING TERTIARY AMINES AS COINITIATORS

[75] Inventors: Paul D. Davis, Centerville; Gary F. Hillenbrand, Chillicothe; Paul C. Adair, Springboro, all of Ohio

[73] Assignee: The Mead Corporation, Dayton, Ohio

[21] Appl. No.: 300,168

[22] Filed: Jan. 19, 1989

Related U.S. Application Data

[63] Continuation of Ser. No. 755,400, Jul. 16, 1985, abandoned.

[51] Int. Cl.⁵ .......................... G03C 1/68; G03C 1/72
[52] U.S. Cl. ..................................... 430/438; 430/281;
430/916; 430/919; 430/921; 430/926
[58] Field of Search .............. 430/281, 916, 919, 926, 430/921, 138; 204/159.22, 159.23

[56] References Cited

U.S. PATENT DOCUMENTS

| | | | |
|---|---|---|---|
| 4,071,424 | 1/1978 | Dart et al. | 204/159.19 X |
| 4,113,593 | 9/1978 | Barzynski et al. | 430/919 |
| 4,366,228 | 12/1982 | Specht et al. | 430/916 X |
| 4,367,280 | 1/1983 | Kondo et al. | 430/918 X |
| 4,399,209 | 8/1983 | Sanders et al. | 430/138 |
| 4,414,312 | 11/1983 | Goff et al. | 430/288 X |
| 4,439,515 | 3/1984 | Shinozaki et al. | 430/281 X |
| 4,440,846 | 4/1984 | Sanders et al. | 430/138 |
| 4,507,497 | 3/1985 | Reilly, Jr. | 204/159.23 |
| 4,525,256 | 6/1985 | Martin | 430/919 X |
| 4,529,681 | 7/1985 | Usami et al. | 430/281 X |

*Primary Examiner*—Paul R. Michl
*Assistant Examiner*—Patrick A. Doody
*Attorney, Agent, or Firm*—Thompson, Hine and Flory

[57] ABSTRACT

Imaging materials employing photosensitive microcapsules having improved film speed are disclosed wherein the microcapsules contain a photoinitiator system including an absorber, a coinitiator and an autoxidizer; the absorber is a compound such as an aromatic ketone, the coinitiator and the autoxidizer are different but may be compounds such as N,N-dialkylanilines; the coinitiator and autoxidizer are selected such that free radical generation and oxygen consumption occur with optimum efficiency thereby providing an imaging material having high film speed.

24 Claims, No Drawings

4,940,645

IMAGING MATERIAL EMPLOYING PHOTOSENSITIVE MICROCAPSULES CONTAINING TERTIARY AMINES AS COINITIATORS

This is a continuation of co-pending application Ser. No. 755,400 filed July 16, 1985, now abandoned.

BACKGROUND OF THE INVENTION

The present invention relates to an improved imaging material of the type employing microcapsules containing a photosensitive composition. More particularly, it relates to imaging materials in which the photosensitive composition contains a photoinitiator system which includes an absorber, a coinitiator, and autoxidizer to provide improved film speed.

Imaging systems employing photosensitive microcapsules are described in commonly assigned U.S. Pat. Nos. 4,399,209 and 4,440,836 and commonly assigned U.S. applications Ser. No. 339,917 filed January 18, 1982, and Ser. No. 620,994 filed June 15, 1984. The imaging systems, in their simplest form, comprise an imaging sheet having a layer of photosensitive microcapsules coated on one surface. The internal phase of the microcapsules includes a photosensitive composition and, more typically, a photocurable composition which cures by free radical addition polymerization. In the most typical embodiments, the internal phase also includes an image-forming agent such as a substantially colorless electron donating color former.

Images are formed using the aforementioned systems by image-wise exposing the layer of microcapsules to actinic radiation and subjecting the layer to a uniform rupturing force in the presence of a developer material. U.S. Pat. No. 4,399,209 discloses a transfer imaging system in which the developer material is provided on a support which is separate and distinct from the imaging sheet. After exposing the imaging sheet, it is assembled with the developer carrying sheet and the two are passed together between a pair of pressure rollers with their reactive faces in contact. U.S. Pat. No. 4,440,846 describes a self-contained system in which the developer is provided on the same surface of the support as the photosensitive microcapsules. Upon rupturing the microcapsules, the color former is image-wise released and reacts with the developer to provide a color image.

U.S. applications Ser. Nos. 339,917 and 620,994 describe full color imaging systems in which three sets of microcapsules respectively containing cyan, magenta and yellow color formers are provided on one or separate supports and image-wise exposed using color separation techniques. In one embodiment, the three sets of the microcapsules have distinct sensitivities such that they can be mixed and exposed on the surface of a single support.

While the imaging systems and photosensitive microcapsules described in the aforementioned patents and patent applications are useful in forming images, there is a need for higher film speeds than have previously been achieved.

SUMMARY OF THE INVENTION

It has been determined that essentially all the exposure energy required to achieve the minimum degree of chemistry before imaging begins (i.e., to achieve a minimum change in density) is used in consuming oxygen originally present in the microcapsule. This degree of exposure corresponds to the shoulder of the H & D curve for the imaging material. Upon exposing an imaging sheet, radicals are generated in the microcapsules in a well known manner. When oxygen is present in the microcapsules, the radicals readily react with it and the degree of polymer building required to control image density cannot proceed sufficiently until the oxygen is depleted.

The applicants have calculated that in a typical photosensitive microcapsule there are $1.8 \times 10^8$ molecules of oxygen ($O_2$). At a typical exposure of 100 ergs/cm$^2$ to the shoulder of the H and D curve of a 350 nm absorbing system about $3.5 \times 10^6$ photons are incident upon the capsule before an image is produced. The initiator concentrations used are usually such that only about 44% of the incident photons or $1.5 \times 10^6$ photons are absorbed in attaining the shoulder speed. This is at least two orders of magnitude less than required to consume all the oxygen in the molecule, assuming unity quantum efficiency for its consumption. Thus, for an imaging material employing photosensitive microcapsules to image with high film speed, the oxygen must be consumed with a high quantum efficiency.

On this basis, the applicants have found that, to achieve high film speed, a photoinitiator system is required which is not only efficient in generating free radicals but is also efficient in consuming oxygen.

The shoulder speed of an imaging material employing photosensitive microcapsules is a product of the quantum efficiency of the initiator system in generating radicals ($\Phi_{fr}$) and the quantum efficiency of the system in reacting with oxygen ($\Phi_{ao}$). The quantum efficiency $\Phi_{fr}$ can range from 0 to 2. The quantum efficiency $\Phi_{ao}$ can range from 1 to greater than 10,000. Both efficiencies must be maximized to achieve high film speed. In accordance with the present invention, this is accomplished by using a photoinitiator system containing a compound which interacts efficiently with the absorber to generate free radicals (a coinitiator) and a second, different compound (an autoxidizer) which reacts efficiently with oxygen. While a coinitiator will also react with oxygen and an autoxidizer will also react with an absorber, it has been found that by selecting compounds which are particularly effective in these two individual reaction mechanisms, a highly sensitive imaging material is achieved.

In accordance with the present invention, the coinitiator is preferably a tertiary amine and, more particularly, an N,N-dialkylaniline or a thiol. The autoxidizer is preferably selected from among a group of compounds including tertiary amines, thiols, and phosphines.

The imaging system of the present invention is characterized in that the internal phase of the microcapsules comprises a free radical addition polymerizable compound, and a photoinitiator system including an absorber such as an aryl ketone, a coinitiator, such as a tertiary amine, and an autoxidizer such as a tertiary amine, a thiol, or phosphine.

Definitions

The term "microcapsule" as used herein includes both microcapsules having a discrete capsule wall as well as so-called open phase systems in which the constituents making up the internal phase of the microcapule are dispersed in a binder.

The term "actinic radiation" as used herein includes the full spectrum of electromagnetic radiation as well as x-ray, ion beam, and gamma radiation. Preferred systems in accordance with the present invention are sensitive to ultraviolet radiation or blue light (e.g., 350 to 480 nm).

Hammett's constants are determined in accordance with Leffler and Grunwald, *Rates and Equilibria of Organic Reactions*, John Wiley & Sons, Inc., 1963 pp 172-177 and are determined for the para- or meta-position.

Shoulder speed, 90% speed and $D_{90}$ are equivalent terms and refer to the sensitivity, either absolute or relative, e.g. step number of step tablet exposure, at 90% of maximum density achieved, i.e., density in the plateau region of the H and D curve.

Toe speed, 10% speed and $D_{10}$ are equivalent terms and refer to the sensitivity, either absolute or relative, e.g. step number of step tablet exposure, at 10% density of maximum density achieved in a (the) particular sample.

DETAILED DESCRIPTION OF THE INVENTION

The microcapsules and imaging sheets of the present invention can be prepared by using the techniques described in U.S. Pat. Nos. 4,399,209 and 4,440,846 and U.S. applications Ser. Nos. 339,917 and 620,994 which are incorporated herein by reference.

A principal example of the coinitiators and autoxidizers used in the present invention are N,N-dialkylanilines. These compounds are characterized in that they are not absorbers. That is not to say that they do not absorb radiation, but that they are used in an initiator system in which another compound, namely the "absorber" is the principal absorber of actinic radiation. Stated differently, the N,N-dialkylanilines used in the present invention have a much lower extinction coefficient than the absorber at the exposure wavelength.

Both the coinitiator and the autoxidizer can be an N,N-dialkylaniline. An N,N-dialkylaniline which is efficient in free radical generation is selected as the coinitiator and a different N,N-dialkylaniline, which is efficient in generating radicals through reacting with oxygen radicals, is used as the autoxidizer.

Representative examples of N,N-dialkylanilines useful as coinitiators or autoxidizers in the present invention are represented by the formula (I)

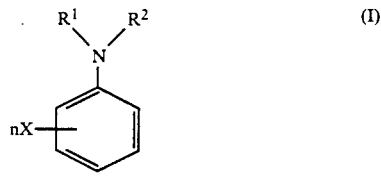

where $R^1$ and $R^2$ are alkyl groups having 1 to 6 carbon atoms and preferably 1 to 4 carbon atoms, n is an integer of 1 to 5, and X is a substituent having a Hammett's $\sigma$ (para) constant in the range of $-0.9$ to 0.7. Preferred X have a Hammett's constant in the range of $-0.5$ to 0.5 and still more preferred X have a constant in the range of $-0.2$ to 0.5. Representative examples of X are a hydrogen atom, a cyano group, a halogen atom (e.g., fluorine, chlorine, or bromine), an alkyl group having 1 to 3 carbon atoms, a hydroxyl group, an alkoxy group having 1 to 3 carbon atoms (e.g., ethoxy), an amino group, a dialkylamino group wherein the alkyl groups have 1 to 3 carbon atoms, an acyl group having 2 to 6 carbon atoms (e.g., acetyl), an acylamido group having 2 to 6 carbon atoms (e.g., acetylamido), an alkylsulfido group having 2 to 4 carbon atoms (e.g., $-SCH_3$), a phenyl group, a hydroxy group, a be the same or different.

The position of the X substituent(s) affects the ability of the aniline to effect net hydrogen transfer. In the preferred compounds, X is ortho-, meta- or para- with respect to the dialkylamino group.

Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylthioanicidine, 4-amino-N,N-dimethylaniline, 3-hydroxy-N,N-dimethylaniline, N,N,N',N'-tetramethyl-1,4-dianiline, 4-acetamido-N,N-dimethylaniline, etc.

Examples of more preferred N,N-dialkylanilines are dialkylanilines substituted in the ortho-, meta- or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl ylstannyl, n-butoxy, n-pentyloxy, phenoxy, hydroxy, acetyloxy, methylthio, ethylthio, isopropylthio, thio(mercapto-), acetylthio, fluoro, chloro, bromo and iodo.

The dialkylanilines are preferably used in the present invention in concentrations of about 0.025 to 0.5 molar.

Preferred examples of N,N-dialkylanilines which are typically used as coinitiators in the present invention are ethyl-p-(dimethylamino)benzoate (EPD), 2-n-butoxyethyl-4-(dimethylamino)-benzoate, and ethyl-o-(dimethylamino)-benzoate. N,N-dialkylanilines substituted with an alkyl group in the ortho-position are often good autoxidizers. Preferred examples of N,N-dialkylanilines typically useful as autoxidizers are 2,6-diisopropyl-N,N-dimethylaniline, 2,6-diethyl-N,N-dimethylaniline, N,N,2,4,6-pentamethylaniline and p-t-butyl-N,N-dimethylaniline.

Another particularly useful class of compounds useful in the present invention are thiols such as mercaptobenzoxazoles, mercaptotetrazines, and mercaptotriazines. Specific examples of useful thiols include: 2-mercaptobenzothiazole, 6-ethoxy-2-mercaptobenzothiazole, 2-mercaptobenzoxazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzenethiol, 1-phenyl-1H-tetrazole-5-thiol, 4-phenyl-4H-1,2,4-triazole-3-thiol, 2-mercaptobenzimidazole, pentaerythritol tetrakis(mercaptoacetate), pentaerythritol tetrakis(3-mercaptopropionate), trimethylolpropane tris(mercaptoacetate), trimethylolpropane tris(3-mercaptopropionate), 4-acetamidothiophenol, mercaptosuccinic acid, dodecanethiol, 2-mercaptopyridine, 4-mercaptopyridine, 2-mercapto-3H-quinazoline, and 2-mercaptothiazoline. These compounds are sometimes used as autoxidizers, however, as shown in Reference Example 4, many thiols are useful as co-initiators in the present invention. More particularly significant improvements in film speed have been achieved using thiols such as 2-mercaptobenzoxazole (MBO), 6-ethoxy-2-mercaptobenzothiazole (EMBT) and phenyl mercaptotetrazole (PMT) in combination with good autoxidizers such as N,N,2,4,6-pentamethylaniline.

Phosphines may also be useful autoxidizers. Representative examples of phosphines that are potentially useful include: triphenylphosphine, triethylphosphite, triethylphosphine, triisopropylphosphite, and triphenylphosphite.

In accordance with the present invention, the coinitiator and autoxidizer are used in combination with one or more absorbers, which function as the principal radiation absorber(s), to provide a photoinitiator system. The absorber, as distinguished from the coinitiator and autoxidizer principally absorbs incident radiation and initiates the generation of free radicals. Absorbers which are useful in the present invention generate free radicals via a net hydrogen atom transfer, e.g., via direct hydrogen abstraction or an electron transfer/proton transfer sequence. Preferred photoinitiators are aryl ketones such as: benzophenone, 4,4'-dimethoxybenzophenone, 4,4'-dichlorobenzophenone, 4,4'-bis(dimethylamino) benzophenone, benzanthone, 9-fluorenone, xanthone, 2-methylxanthone, 2-dodecylxanthone, thioxanthone, 2-methylthioxanthone, 2-dodecylthioxanthone, 2-chlorothioxanthone, 2-isopropylthioxanthone, and 3-cinnamoyl-7-diethylaminocoumarin. These photoinitiators can be used alone or in combination with other photoinitiators. Preferred initiators include thioxanthanes, phenanthrenequinones, and ketocoumarins such as those listed in U.S. Pat. No. 4,147,552 to Specht et al. Benzophenones are less desirable.

Typically the molar ratio of the combined autoxidizer and coinitiator to the absorber is 1:3 to 100:1. The ratio will depend on the compounds selected, the extinction coefficients of the absorber, etc. The ratio of the coinitiator to the autoxidizer will also vary. A ratio is selected which maximizes the efficiency of each reaction with minimal interference with either. It has been found that in many cases, the molar ratio of the coinitiator to the autoxidizer is about 5:1 to 1:1.

As a general rule, the photosensitive composition containing the photoinitiator system should provide a microcapsule having a sensitivity (E) less than 1,000 ergs/cm$^2$ and more preferably less than 500 ergs/cm$^2$ in the desired exposure range. The term "sensitivity" corresponds to the amount of incident radiation required to produce a first change in density of 0.10 density units. The photosensitive microcapsules of the present invention are typically positive working. When not exposed, the microcapsules rupture and release the color former which reacts with the developer to produce a maximum image density. Thus, the term "sensitivity" or "shoulder speed" represents the minimum exposure necessary to effect a substantive reduction (0.10 density units) in that maximum density.

Examples of photoinitiator systems in accordance with the present invention are:
As absorbers:
3-cinnamoyl-7-diethylaminocoumarin
2-isopropylthioxanthone
4-isopropylthioxanthone
As coinitiators:
ethyl-p-dimethylaminobenzoate
ethyl-o-dimethylaminobenzoate
2-n-butoxyethyl-4-dimethylaminobenzoate
6-ethoxy-2-mercaptobenzothiazole
2-mercaptobenzoxazole
As autoxidizers:
4-t-butyl-N,N-dimethylaniline
2,4,N,N-tetramethylaniline
2,6,N,N-tetramethylaniline
N,N,2,4,6-pentamethylaniline
2,6-diethyl-N,N-dimethylaniline
2,6-diisopropyl-N,N-dimethylaniline
4,N,N-trimethylaniline As demonstrated below, coinitiators vis-a-vis autoxidizers can be selected by comparing the film speeds obtained using the N,N-dialkylanilines in air and vacuum. Compounds providing good film speed in air are useful autoxidizers and compounds providing good film speed in vacuum are good coinitiators. Thus, for a given monomer and absorber, a coinitiator will provide higher film speed than an autoxidizer when a photosensitive composition is exposed in a vacuum, and an autoxidizer will provide higher film speed than a coinitiator when a photosensitive composition is exposed in air.

The photosensitive compositions used herein are curable by free radical addition polymerization and most typically ethylenically unsaturated compounds, e.g., compounds containing one or more terminal or pendant vinyl or allylic groups. Such compounds are well known in the art and include acrylic and methacrylic esters of polyhydric alcohols such as trimethylolpropane, pentaerythritol, and the like. Representative examples include ethylene glycol diacrylate, ethylene glycol dimethacrylate, trimethylolpropane triacrylate (TMPTA), pentaerythritol tetraacrylate, pentaerythritol tetramethacrylate, hexanediol1,6-dimethacrylate, 1,6-hexanediol diacrylate, dipentaerythritol monohydroxypentaacrylate (DPHPA) and diethyleneglycol dimethacrylate.

In accordance with one embodiment of the present invention, the radiation sensitive composition may additionally include a polythiol to increase the film speed of the microcapsules.

Useful polythiols include ethylene glycol bis (thioglycolate), ethylene glycol bis ($\beta$-mercaptopropionate), trimethylolpropane tris (thioglycolate), pentaerythritol tetrakis (thioglycolate), pentaerythritol tetrakis ($\beta$-mercaptopropionate) and trimethylolpropane tris ($\beta$-mercaptopropionate), and mixtures thereof. These compounds are commercially available. Certain polymeric polythiols such as polypropylene ether glycol bis ($\beta$-mercaptopropionate) which is prepared by esterification of polypropylene ether glycol may also be useful.

Various oligomers or polymers can also be used in the present invention to improve the film speed of the microcapsules. These materials increase the rate with which the viscosity of the internal phase of the microcapsules builds to a level at which differential release of the internal phase is achieved but the exact mechanism is not clear. These materials must be soluble in the photosensitive composition and not interfere with the photopolymerization reaction. Reactive oligomers contain terminal ester and epoxy based reactive acrylate, methacrylate, vinyl and allyl prepolymers. Useful non-reactive oligomers are polymers which are solid or semisolid at room temperature but soluble in the unreacted photosensitive composition. Representative examples of some commercially available oligomers or polymers which are useful in the present invention include reactive materials such as diallyl o-phthalate prepolymer (Polysciences), Uvithane 893 (Morton Thiokol, Inc.), Ebercryl 270 (Virginia Chemicals) and non-reactive materials such as ethyl cellulose, or Lucite.

In addition to the photosensitive composition, the internal phase may additionally include a diluent oil. Inclusion of the oil often improves mid tone gradation in visual images. Preferred diluent oils are weakly polar solvents having boiling points above 170° C and preferably in the range of 180° to 300° C. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls and kerosene are generally less toxic and preferred. The amount of diluent oil incorporated in the microcapsules will depend upon the photographic characteristics that are desired in the photosensitive materials. Typically, the diluent oil is used in an amount of approximately 10 to 20% by weight based on the weight of the internal phase.

One example of an image-forming agent useful in the invention is colorless electron donating compounds. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. There are numerous examples of these compounds in the carbonless paper art. Crystal Violet Lactone, Copikem X, IV, XI, XX (Hilton-Davis Co.), and Reakt Yellow 186 (BASF Aktiengesellschaft) are examples of compounds which are often used alone or in combination as color precursors in the present invention.

Images can also be formed using, as the image-forming agent, a chelating agent which reacts with a metal salt, as a developer, to generate a color image upon being released from the microcapsules. Some typical examples of useful image-forming pairs of this type are nickel nitrate, and N,N' bis (2-octanoyloxyethyl)dithiooxamide, and alum [Fe(III)]and yellow prussiate.

Substantially, any color-forming agent which can be encapsulated and which will react with a developer material to form an image can be used in the present invention.

The image-forming agent may be associated with the microcapsules in various ways such that upon release of the internal phase, the image-forming agent is able to react and/or migrate to produce an image. It is typically encapsulated with the photosensitive composition, in the microcapsules, however, it may also be incorporated in the walls of the microcapsules or in a layer contiguous to the microcapsules. Those skilled in the art will appreciate that various arrangements can be used provided that the activation or mobilization of the image-forming agent is controlled by rupturing the microcapsules and releasing the internal phase. Furthermore, either the color former or the color developer may be associated with the microcapsules. It is not always necessary to encapsulate the color former, as is the more common practice.

In general, the color former is present in an amount of approximately 0.5 to 20% by weight based on the weight of the internal phase. A preferred range is about 2 to 24% by weight. Transfer imaging materials usually contain about 10% by weight of the color former whereas self-contained materials contain about 1.5 to 3% by weight of the image-forming agent. The relative amounts of the cyan, magenta and yellow color formers in the microcapsules in a full color system are adjusted to provide satisfactory color balance. In conjunction with this, the relative amounts of the microcapsules in the coating composition can be adjusted to improve color balance.

In a full color imaging system it is often desirable to incorporate an absorber compound such as an ultraviolet absorber in the internal phase to narrow the spectral sensitivity of the microcapsules. Useful absorbers are described in commonly assigned U.S. application Ser. No. 620,994.

The photosensitive microcapsules of the present invention can be formed using known encapsulation techniques. The photosensitive composition and associated agents can be encapsulated in hydrophilic wall-forming materials such as gelatin-type materials (see U.S. Pat. Nos. 2,730,456 and 2,800,457 to Green et al) including gum arabic, polyvinyl alcohol, carboxy-methyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanatepolyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle). Urea-formaldehyde microcapsules are preferred for use in the present invention. Methods for producing urea formaldehyde capsules which are particularly useful are described in U.S. Pat. Nos. 4,251,386 and 4,138,362.

The mean size of the microcapsules of the present invention generally ranges from approximately 1 to 25 microns. As a general rule, image resolution improves as capsule size decreases except that if the capsule size is too small, the capsules may disappear in the pore or fiber structure of some substrates.

The microcapsules of the present invention can be used to form either transfer or self-contained imaging systems, i.e., systems in which the developer is on the same or a separate support from the microcapsules. A detailed description of transfer materials can be found in U.S. Pat. No. 4,399,209. Self contained systems are the subject of commonly assigned U.S. Pat. No. 4,440,846.

Illustrative examples of color developers useful with the electron donating type color precursors are clay minerals such as acid clay, active clay, attapulgite, etc.; organic acids such as tannic acid, gallic acid, propyl gallate, etc.; acid polymers such as phenolformaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tertbutyl salicylate, zinc 3-cyclohexyl-5-($\alpha,\alpha$-dimethylbe salicylate (see U.S. Pat. Nos. 3,864,146 and 3,934,070), zinc 3,5,-di-methylbenzyl) salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

The most common substrate for the photosensitive material of this invention is paper. The paper may be a commercial impact raw stock, or a special grade paper such as cast-coated paper or chrome-rolled paper. Transparent substrates such as polyethylene terephthalate and translucent substrates can also be used in this invention.

The present invention is illustrated in more detail by the following non-limiting examples wherein the following procedures were used:

CAPSULE PREPARATION

1. Into a 600 ml stainless steel beaker, 416 g water and 22.3 g isobutylene maleic anhydride copolymer (20.6%) are weighed.
2. The beaker is clamped in place on a hot plate under an overhead mixer. A six-bladed, 45° pitch, turbine impeller is used on the mixer.
3. After thoroughly mixing, 3.1 g pectin is slowly sifted into the beaker. This mixture is stirred for 20 minutes.
4. The pH is adjusted to 4.0 using a 20% solution of $H_2SO_4$.
5. The mixer is turned up to 3000 rpm and the internal phase is added over a period of 10–15 seconds. Emulsification is continued for 10 minutes.
6. At the start of emulsification, the hot plate is turned up so heating continues during emulsification.
7. After 10 minutes, the mixing speed is reduced to 2000 rpm and 16.6 g urea solution (50% w/w), 0.8 g resorcinol in 10 g water, 21.4 g formaldehyde (37%), and 0.6 g ammonium sulfate in 10 ml water are added at two-minute intervals.
8. The beaker is covered with foil and a heat gun is used to help bring the temperature of the preparation to 65° C. When 65° C is reached, the hot plate is adjusted to maintain this temperature for a two to three hour cure time during which the capsule walls are formed. 9. After curing, the heat is turned off and the pH is adjusted to 9.0 using a 20% NaOH solution.
10. Dry sodium bisulfite (2.8 g) is added and the capsule preparation is cooled to room temperature.

IMAGING SHEET PREPARATION

Capsule preparations (10 g) obtained as outlined above were mixed with 8 g of 10% Triton X-100 (Rohm & Haas Company) in water and 2 g of 10% Klucel L (Hercules, Inc.) and the resultant mixture was coated on 80 lb Black and White Glossy stock (The Mead Corporation) with a No. 12 wire-wound rod and dried at 90° C for 1/2 hour.

DEVELOPER SHEET PREPARATION

A mixture of 852 g water, 250 g 25% Tamol 731 (Rohm & Haas Company), 75 g HT clay, 1000 g KC-11 (a synthetic developer manufactured by Fuji Photo Film Company, Ltd.), 15 g Calgon T (Calgon, Inc.), 30 g Dequest 2006 (Monsanto Co.) was ground to a particle size less than 5 microns. To this mixture was added 25 parts HT clay and 10 parts Dow 501 latex per 65 parts of the mixture. The resultant material was coated with a #10 Meyer bar on 80 lb Black and White Enamel base stock at 30 to 35% solids.

REFERENCE EXAMPLE 1

Microcapsules were prepared as outlined above containing, as the internal phase:

| | Parts |
|---|---|
| TMPTA | 26 g |
| DPHPA(Dipentaerythritol monohydroxypentaacrylate) | 14 g |
| 3-Cinnamoyl-7-diethylaminocoumarin | 0.1 g |
| Substituted Dimethylaniline | |
| Propylene carbonate | 10 g |
| Copikem XX | 1 g | wherein the substituted dimethylaniline is shown in Table 1 below. The dimethylaniline was used in an amount of 0.32 or 0.16 mole/liter depending on which gave the best D90 sensitivity. Imaging sheets were prepared as outlined above and exposed to radiation ($\lambda$=470 nm) through a 30 step wedge (Stauffer) and developed against an acid developer sheet. The exposure device was a Kratos 1000W monochromator system. The monochromator was set at 470nm (20nm bandpass). The imaging sheets provided the absolute sensitivities shown in Table 1.

TABLE 1

| N,N-dimethylaniline | Sensitivity (ergs/cm2) at D90 |
|---|---|
| p-CN | 7400 |
| p-CF$_3$ | 2470 |
| m-CF$_3$ | 740 |
| p-CO$_2$C$_2$H$_5$ | 1350 |
| p-CH$_2$—N9CH$_3$)$_2$ | 1170 |
| p-t-butyl | 350 |
| 2,6-dimethyl | 190 |
| 3,5-dimethyl | 1800 |
| p-OC$_2$H$_5$ | 6750 |
| p-CH$_3$ | 380 |
| p-F | 450 |
| p-phenyl | 480 |
| p-CH$_2$—O—N(CH$_3$)$_2$ | 580 |
| 2,6-diethyl | 180 |
| 2,6-diisopropyl | 170 |
| 2,4,6-trimethyl | 120 |
| N,N-dimethylaniline | 840 |
| N,N-diethylaniline | 2040 |
| N,N-dibutylaniline | 960 |

REFERENCE EXAMPLE 2

Compounds were evaluated for their efficiency as autoxidizers and coinitiators by preparing microcapsules and imaging sheets as above using, as the internal phase, a composition containing TMPTA, 2% isopropylthioxanthone (as the absorber), 6% of a cyan color precursor, and 0.21 M of test compound.

Samples were coated on 80 lb. Black and White Glossy. Exposures were made on a Kratos SS 1000X Solar Simulator (1000 W Xenon source) through a Stauffer 30- step wedge and a 390 nm interference filter for 8 seconds each. Samples were exposed while positioned in a vacuum frame. For vacuum tests, the system was evacuated with an oil pump for 10 minutes prior to exposure. Air exposures were made identically except for the evacuation step. The imaging sheets were developed by passing them through a laboratory pressure roll in contact with the developer sheet described above. The compounds tested were N,N,2,4,6-pentamethylaniline (PMA), p-t-butyl-N,N-dimethylaniline (DMA, Aldrich), ethyl-o-(dimethylamino)benzoate (EOB, Ward-Blenkinsop), 2-n-butoxyethyl-4-(dimethylamino)-benzoate (BEA, Ward-Blenkinsop), 2-(dimethylamino)ethylbenzoate (DMB, Ward-Blenkinsop), ethyl-p-(dimethylamino)-benzoate (EDP, Ward-Blenkinsop), and N,N,3-5-tetramethylaniline (TMA, Aldrich).

The results are listed below. All speeds are given in step number. Samples are listed from the photographically fastest to slowest.

| | | | Air Exposures | | | | |
|---|---|---|---|---|---|---|---|
| 90% Speed | PMA 11.37 | DMA 10.53 | EOB 10.00 | BEA 9.37 | DMB 9.05 | EPD 8.02 | TMA 4.86 |
| 10% Speed | EOB 6.34 | BEA 5.99 | PMA 5.77 | EPD 4.81 | DMB 4.22 | DMA 3.09 | TMA 1.43 |
| | | | Vacuum Exposures | | | | |
| 90% Speed | BEA 21.49 | EOB 21.36 | EPD 20.91 | TMA 20.3 | DMB 20.05 | DMA 19.39 | PMA 18.46 |
| 10% Speed | BEA 10.86 | EOB 10.67 | EPD 10.64 | DMB 9.68 | TMA 8.06 | PMA 7.00 | DMA 6.59 |

From these observations, one may conclude that no one of the dimethylanilines tested possesses both the high photopolymerization efficiency and the high oxidation efficiency necessary for maximum photographic speed in air. A combination of two different donor species which excel at each of these two different reactions, however, will lead to enhanced film speed. From the air exposures, it can be observed that PMA possesses the highest shoulder speed of any of the compounds tested and also possesses one of the faster toe speeds. Similarly, DMA possesses a high shoulder speed in air. This situation was dramatically reversed for the vacuum exposures, wherein the PMA and DMA were the slowest with respect to both shoulder and toe speeds. At the same time, BEA, EOB, and EPD possess fairly equivalent speeds in vacuum—the fastest of those compounds tested. These observations lead one to conclude that the compounds PMA and DMA are very efficient at oxygen consumption, but are not so efficient at initiating the polymerization. The compounds BEA, EOB, and EPD are efficient as initiators (as witnessed by the high vacuum speeds), but are not as efficient for oxygen consumption.

REFERNCE EXAMPLE 3

Reference Example 2 was repeated using various ratios of PMA and EPD in the photoinitiator system, but 8% of the cyan precursor was used instead of the 12% used in Example 2. Exposures were made with a light source consisting of one 15T8 BL and one 15T8/D fluorescent tube through a $$\sqrt[3]{2}$$

step wedge and at a distance of 6 inches from the light source. The sensitometric data is shown in Table 2.

TABLE 2

| 2 PMA | 13.16 |
|---|---|
| 2 EPD | 13.57 |
| 1 PMA/2 EPD | 11.79 |
| 0.25 PMA/2 EPD | 14.01 |
| 0.5 PMA/2 EPD | 13.81 |
| 2 PMA/2 EPD | 11.70 |

REFERENCE EXAMPLE 4

The compounds shown in Table 3 below were encapsulated with TMPTA, 2% isopropylthioxanthone, 4% 2,4,6,N,N-pentamethylaniline (a good autoxidizer), and a cyan color precursor in order to identify efficient hydrogen donors. The $D_{90}$ and $D_{10}$ film speeds are shown in Table 3.

TABLE 3

| Compound (g/50 ml) | D90 | D10 |
|---|---|---|
| PMA(2) (Control) | 22.39 | 13.29 |
| 2-Mercaptobenzoxazole(1.0) | 23.05 | 17.21 |
| Dimethylaminobenzaldehyde(1.0) | 17.80 | 12.44 |
| Tribenzylamine(1.0) | 16.97 | 11.15 |
| Morpholinobenzophenone(1.0) | 22.06 | 13.95 |
| 2,6-Diisopropyl-N,N-DMA(1.0) | 20.16 | 11.92 |
| 4-t-Butyl-N,N-DMA(1.0) | 19.56 | 9.93 |
| 2,4,N,N-Tetramethylaniline(1.0) | 20.26 | 11.62 |
| Phenylmercaptotetrazole(0.25) | 20.31 | 14.65 |
| 2,3,N,N-Tetramethylaniline(1.0) | 17.87 | 12.05 |
| 6-Ethoxy-2-mercaptobenzothiazole(1.0) | 22.08 | 17.25 |
| DMA-pyridine(1.0) | 21.57 | 11.52 |
| Octadecylmercaptopropionate (1.0) | 21.95 | 13.38 |

The data shows that no compound significantly increased the shoulder speed. Three compounds in particular increased toe speed, namely, 2-mercaptobenzoxazole (MBO), 6-ethoxy-2-mercaptobenzothiozole (EMBT), and phenylmercaptotetazole (PMT). The high degree of synergism obtainable from PMA/thiol conbinations is shown in Table 4.

TABLE 4

| | Step Number | |
|---|---|---|
| Initiators (%) | D90 | D10 |
| MBO (2%) | 15.17 | 11.53 |
| MBO (4%) | 17.17 | 12.94 |
| EMBT (2%) | 16.41 | 12.03 |
| PMA (4%) | 22.39 | 13.29 |
| PMA (4%) MBO (2%) | 23.05 | 17.21 |
| PMA (4%) EMBT (2%) | 22.08 | 17.25 |

Having described the invention in detail and by reference to preferred embodiments thereof, it will be apparent that modifications and variations are possible without departing from the scope of the invention defined in the appended claims.

What is claimed is:

1. A photosensitive microcapsule having improved film speed comprising, as the internal phase, a photosensitive composition including a free radical addition polymerizable material, and a photoinitiator system, wherein said photoinitiator system includes an absorber, a coinitiator and an autoxidizer, said absorber, said coinitiator and said autoxidizer being different, said coinitiator being a compound which is more efficient in yielding free radicals by interacting with said absorber than said autoxidizer and said autoxidizer being more efficient in yielding free radicals by interacting with oxygen or oxygen radicals than said co-initiator, the quantum efficiency of said photosensitive composition in reacting with oxygen being substantially greater than 1, wherein said absorber is an aryl ketone, said co-initiator is an N,N-dialkylaniline represented by the formula

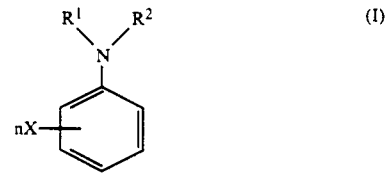

wherein $R^1$ and $R^2$ are the same or different and represent an alkyl group having 1 to 6 carbon atoms or a benzyl group; and x a substituent having a Hammett's constant in the range of −0.9 to 0.7 and said autoxidizer is a thiol.

2. The photosensitive microcapsule of claim 1 wherein said microcapsule has a discrete capsule wall.

3. The photosensitive microcapsule of claim 2 wherein said free radical addition polymerizable material is an ethylenically unsaturated compound.

4. The photosensitive microcapsule of claim 1 wherein X is selected from the group consisting of a hydrogen atom, a cyano group, a halogen atom, an alkyl group, an acyl group, an alkoxy group, an amino group, a dialkylamino group, an acylamido group and an alkylsulfido group.

5. The photosensitive microcapsule of claim 4 wherein said substituents have a Hammett's σ constant in the range of −0.5 to 0.5.

6. The photosensitive microcapsule of claim 5, wherein $R^1$ and $R^2$ are methyl or ethyl.

7. The photosensitive microcapsule of claim 4 wherein X has a Hammett's constant value of −0.2 to 0.5.

8. The photosenstive microcapsule of claim 7 wherein said aryl ketone has λ max greater than about 380 nm.

9. An imaging sheet having improved film speed comprising a support having on a surface thereof a layer containing photosensitive microcapsules, said microcapsules including in the internal phase thereof a free radical addition polymerizable material, a photoinitiator system, and an image-forming agent, wherein said photoinitiator system includes an absorber, a co-initiator and an autoxidizer, said absorber, said co-initiator and said autoxidizer being different, said co-initiator being a compound which is more efficient in yielding free radicals by interacting with said absorber than said autoxidizer and said autoxidizer being more efficient in yielding free radicals be interacting with oxygen or oxygen radicals than said co-initiator, the quantum efficiency of said composition in reacting with oxygen being substantially greater than 1, wherein said absorber is an aryl ketone, said co-initiator is an N,N-dialkylaniline represented by the formula

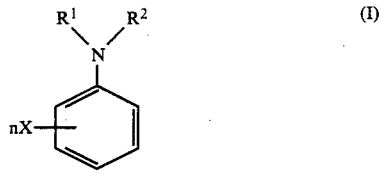

(I)

wherein $R^1$ and $R^2$ are the same or different and represent an alkyl group having 1 to 6 carbon atoms or a benzyl group; and x a substituent having a Hammett's constant in the range of −0.9 to 0.7 and said autoxidizer is a thiol.

10. The imaging sheet of claim 9 wherein said microcapsule has a discrete capsule wall.

11. The imaging sheet of claim 10 wherein said free radical addition polymerizable material is an ethylenically unsaturated compound.

12. The imaging sheet of claim 9 wherein X is selected from the group consisting of a hydrogen atom, a cyano group, a halogen atom, an alkyl group, an acyl group, an alkoxy group, an amino group, a dialkylamino group, an acylamido group and an alkylsulfide group.

13. The imaging sheet of claim 12, wherein $R^1$ and $R^2$ are methyl or ethyl.

14. The imaging sheet of claim 9 wherein X is a substituent having a Hammett's constant of −0.2 to 0.5.

15. The imaging sheet of claim 11 wherein said aryl ketone has λ max greater than about 380 nm.

16. The imaging sheet of claim 14 wherein said image forming agent is a substantially colorless electron donating compound.

17. The photosensitive microcapsule of claim 1 wherein said internal phase additionally includes a substantially colorless electron donating compound.

18. The photosensitive microcapsule of claim 1, wherein said thiol is selected from the group consisting of 2-mercaptobenzothiazole, 6-ethoxy-2-mercaptobenzothiazole, 2-mercaptobenzoxazole, 4-methyl-4H-1,2,4-triazole-3-thiol, 2-mercapto-l-methylimidazole, 2-mercapto-5-methylthio-1,3,4-thiadiazole 5-n-butylthio-2-mercapto-1,3,4-thiadiazole,- 4-methoxybenzenethiol, 1-phenyl-1H-tetrazole-5-thiol, 4-phenyl-4H-1,2,4-triazole-3-thiol, 2-mercaptobenzimidazole, pentaerythritol tetrakis(mercaptoacetate), pentaerythritol tetrakis(3-mercapt-opropionate), trimethylolpropane tris(-mercaptoacetate), trimethylolpropane tris(3-mercaptopropionate), 4-acetamidothiophenol, mercaptosuccinic acid, dodecanethiol, 2-mercaptopyridine, 4-mercaptopyriding, 2-mercapto-3H-quinazoline, and 2-mercaptothiazoline.

19. The photosensitive microcapsule of claim 1, wherein said aryl ketone is selected from the group consisting of benzophenone, 4,4'-dimethoxybenzophenone, 4,4'-dichlorobenzophenone, 4,4'-bis(dimethylamino) benzophenone, benzanthone, 9-fluorenone, xanthone, 2-methylxanthone, 2-dodecylxanthone, thioxanthone, 2-methylthioxanthone, 2-dodecylthioxanthone, 2-chlorothioxanthone, 2-isopropylthioxanthone, and 3-cinnamoyl-7-diethylaminocoumarin.

20. The photosensitive microcapsule of claim 19, wherein said coinitiator is ethyl p-dimethylaminobenzoate.

21. The photosensitive microcapsule of claim 19, wherein said autoxidizer is N,N,2,4,6-pentamethylaniline.

22. The photosensitive microcapsule of claim 19, wherein said autoxidizer is 2,6-diethyl-N,N-dimethylaniline or 2,6-diisopropyl-N,N-dimethylaniline.

23. The photosensitive microcapsule of claim 1 wherein said photoinitiator system consists essentially of said absorber, said co-initiator, and said autooxidizer.

24. The imaging sheet of claim 9 wherein said photoinitiator system consists essentially of said absorber, said co-initiator, and aid autooxidizer.

* * * * *